US011424115B2

(12) United States Patent
Bullock et al.

(10) Patent No.: US 11,424,115 B2
(45) Date of Patent: Aug. 23, 2022

(54) MULTIMODE CONFIGURABLE SPECTROMETER

(71) Applicant: Verity Instruments, Inc., Carrollton, TX (US)

(72) Inventors: Larry Arlos Bullock, Carrollton, TX (US); John D. Corless, Carrollton, TX (US); Richard J. Daignault, Jr., Carrollton, TX (US); Mark Anthony Meloni, Carrollton, TX (US); Mike Whelan, Carrollton, TX (US)

(73) Assignee: Verity Instruments, Inc., Carrollton, TX (US)

( * ) Notice: Subject to any disclaimer, the term of this patent is extended or adjusted under 35 U.S.C. 154(b) by 39 days.

(21) Appl. No.: 15/927,729

(22) Filed: Mar. 21, 2018

(65) Prior Publication Data
US 2018/0286650 A1    Oct. 4, 2018

Related U.S. Application Data

(60) Provisional application No. 62/530,388, filed on Jul. 10, 2017, provisional application No. 62/479,576, filed on Mar. 31, 2017.

(51) Int. Cl.
*H01J 49/02* (2006.01)
*H04N 5/378* (2011.01)
(Continued)

(52) U.S. Cl.
CPC ........... *H01J 49/022* (2013.01); *G01B 11/06* (2013.01); *G01N 21/31* (2013.01); *G01N 21/71* (2013.01);
(Continued)

(58) Field of Classification Search
CPC ............ H04N 3/14–3/34; H04N 5/225; H04N 5/2251; H04N 5/22521; H04N 5/2254;
(Continued)

(56) References Cited

U.S. PATENT DOCUMENTS 5,198,816 A    3/1993  Kalinowski et al.
5,986,267 A *  11/1999 West ................. H01L 27/148
                                              250/370.08
(Continued)

FOREIGN PATENT DOCUMENTS

CN    1817027 A    8/2006
CN  101960580 A    1/2011
(Continued)

*Primary Examiner* — John W Miller
*Assistant Examiner* — Humam M Satti

(57) ABSTRACT

The disclosure provides multimode configurable spectrometers, a method of operating a multimode configurable spectrometer, and an optical monitoring system. In one embodiment the multimode configurable spectrometer includes: (1) an optical sensor configured to receive an optical input and convert the optical input to electrical signals, wherein the optical sensor includes multiple active pixel regions for converting the optical input to the electrical signals, and (2) conversion circuitry, having multiple selectable converting circuits, that is configured to receive and convert the electrical signals to a digital output according to a selected one of the selectable converting circuits.

42 Claims, 7 Drawing Sheets

(51) Int. Cl.

| | | |
|---|---|---|
| *H04N 5/357* | (2011.01) | |
| *G01B 11/06* | (2006.01) | |
| *H04N 5/372* | (2011.01) | |
| *H04N 5/355* | (2011.01) | |
| *H01L 27/148* | (2006.01) | |
| *H04N 5/347* | (2011.01) | |
| *G01N 21/31* | (2006.01) | |
| *G01N 21/71* | (2006.01) | |
| *G01N 21/17* | (2006.01) | |
| *G01J 3/443* | (2006.01) | |

(52) U.S. Cl.
CPC .......... *H01J 49/025* (2013.01); *H01L 27/148* (2013.01); *H04N 5/347* (2013.01); *H04N 5/355* (2013.01); *H04N 5/357* (2013.01); *H04N 5/372* (2013.01); *H04N 5/378* (2013.01); *H04N 5/37213* (2013.01); *G01J 3/443* (2013.01); *G01N 2021/1738* (2013.01)

(58) Field of Classification Search
CPC ....... H04N 5/22541; H04N 2005/2255; H04N 5/2256; H04N 5/2257; H04N 5/23212; H04N 5/232121; H04N 5/232122; H04N 5/232123; H04N 5/232125; H04N 5/23218; H04N 5/23219; H04N 5/23225–5/23235; H04N 5/23238; H04N 5/23245; H04N 5/353; H04N 5/345; H04N 5/2327; H04N 5/235–5/2355; H04N 5/238–5/243; H04N 5/332; H04N 5/335–5/3559; H04N 5/3575; H04N 5/3742; H04N 5/369–379

See application file for complete search history.

(56) References Cited

U.S. PATENT DOCUMENTS

| | | | |
|---|---|---|---|
| 6,160,621 A | 12/2000 | Perry et al. | |
| 6,765,703 B1 * | 7/2004 | Watanabe | H04N 1/40056 341/155 |
| 7,049,156 B2 | 5/2006 | Kueny | |
| 7,989,748 B2 * | 8/2011 | Soeda | H04N 1/401 250/208.1 |
| 8,009,938 B2 | 8/2011 | Davis et al. | |
| 8,179,296 B2 * | 5/2012 | Kelly | H03M 1/60 341/155 |
| 9,386,241 B2 | 7/2016 | Kueny | |
| 2003/0098290 A1 | 5/2003 | Kaji et al. | |
| 2004/0008136 A1 * | 1/2004 | Reyneri | H03M 1/123 341/155 |
| 2005/0001914 A1 * | 1/2005 | Kueny | H04N 5/355 348/294 |
| 2006/0012796 A1 | 1/2006 | Saito et al. | |
| 2007/0031291 A1 * | 2/2007 | Piech | G01J 3/2803 422/82.05 |
| 2007/0249071 A1 * | 10/2007 | Lian | H01L 22/12 438/16 |
| 2008/0158557 A1 * | 7/2008 | Craven | G01J 3/443 356/300 |
| 2010/0141829 A1 * | 6/2010 | Jalali | A61B 1/00009 348/370 |
| 2012/0123581 A1 * | 5/2012 | Smilde | G03F 7/70625 700/105 |
| 2012/0153133 A1 * | 6/2012 | Nelson | H04N 5/37213 250/214 P |
| 2013/0228672 A1 * | 9/2013 | Jung | G11C 7/1051 250/208.1 |
| 2014/0036118 A1 * | 2/2014 | Dowaki | H04N 5/2173 348/294 |
| 2014/0166862 A1 * | 6/2014 | Flock | G01N 21/9501 250/208.2 |
| 2014/0247382 A1 * | 9/2014 | Moldovan | H04N 5/341 348/311 |
| 2014/0313385 A1 * | 10/2014 | Sato | H04N 5/3765 348/302 |
| 2014/0333816 A1 * | 11/2014 | Uchida | H04N 5/37455 348/308 |
| 2016/0314943 A1 * | 10/2016 | Albarede | H01J 37/32981 |
| 2016/0327776 A1 * | 11/2016 | Tsia | G02B 21/14 |
| 2016/0344969 A1 * | 11/2016 | Furukawa | H03M 1/56 |
| 2017/0059477 A1 * | 3/2017 | Feitisch | G01N 21/274 |
| 2017/0264846 A1 * | 9/2017 | Negishi | H04N 9/0451 |
| 2018/0103224 A1 * | 4/2018 | Hsu | H04N 5/378 |
| 2018/0351570 A1 * | 12/2018 | Xhakoni | H03M 1/56 |

FOREIGN PATENT DOCUMENTS

| | | |
|---|---|---|
| CN | 103314440 A | 9/2013 |
| CN | 104115488 A | 10/2014 |
| CN | 104243859 A | 12/2014 |
| CN | 106546333 A | 3/2017 |
| DE | 10152679 A1 | 4/2003 |
| JP | 08154156 A | 6/1996 |
| JP | 2001285700 A | 10/2001 |
| JP | 2003229415 A | 8/2003 |
| JP | 2004507070 A | 3/2004 |
| JP | 2005217448 A | 8/2005 |
| JP | 2006521014 A | 9/2006 |
| JP | 2007527516 A | 9/2007 |
| JP | 2007274162 A | 10/2007 |
| JP | 2013011473 A | 1/2013 |
| JP | 2013098895 A | 5/2013 |
| KR | 20060030888 A | 4/2006 |
| TW | I487888 B | 6/2015 |
| TW | 201533771 A | 9/2015 |

\* cited by examiner

MULTIMODE CONFIGURABLE SPECTROMETER

CROSS-REFERENCE TO RELATED APPLICATIONS

This application claims the benefit of U.S. Provisional Application Ser. No. 62/479,576, filed by Corless et al. on Mar. 31, 2017, entitled "Multimode Configurable Spectrometer," and U.S. Provisional Application Ser. No. 62/530,388, filed by Corless et al. on Jul. 10, 2017, entitled "Multimode Configurable Spectrometer," both which are commonly assigned with this application and are incorporated herein by reference in their entirety.

TECHNICAL FIELD

The disclosure relates, generally, to optical spectroscopy systems and methods of use. One particular embodiment is directed to a system and method for improved configurability and utility of multimode configurable spectrometers used during semiconductor processing.

BACKGROUND

Optical monitoring of semiconductor processes is a well established method for controlling processes such as etch, deposition, chemical mechanical polishing and implantation. Optical emission spectroscopy ("OES") and interferometric endpoint ("IEP") are two basic types of operation for data collection. In OES applications light emitted from the process, typically from plasmas, is collected and analyzed to identify and track changes in atomic and molecular species which are indicative of the state or progression of the process being monitored. In IEP applications, light is typically supplied from an external source, such as a flashlamp, and directed onto a workpiece. Upon reflection from the workpiece, the sourced light carries information, in the form of the reflectance of the workpiece, which is indicative of the state of the workpiece. Extraction and modeling of the reflectance of the workpiece permits understanding of film thickness and feature sizes/depth/widths among other properties.

The constant advance of semiconductor processes toward faster processes, smaller feature sizes and more complex structures places great demands on process monitoring technologies. For example, higher data sampling rates (e.g., optical signal measurements or spectra per second) are required to accurately monitor much faster etch rates on very thin layers where changes in Angstroms (a few atomic layers) are critical such as for Fin Field Effect Transistor (FINFET) and three dimensional (3D) NAND structures. Wider optical bandwidth and greater signal-to-noise ratio are required in many cases both for OES and IEP methodologies to aid in detecting small changes in reflectances and optical emissions. Cost and packaging sizes for monitoring systems are also under constant pressure as the semiconductor process equipment becomes more complex, more deeply integrated and costly itself. All of these requirements seek to drive advancements in the performance of optical monitoring systems for semiconductor processes. The capabilities and adaptability of suitable spectrometers are critical elements of the optical monitoring systems.

The semiconductor industry has been adapting and applying advancements in spectroscopic instruments and systems for many years. For example, see "Apparatus and Method for Enhancing Dynamic Range of Charge Coupled Device-based Spectrograph," U.S. Pat. No. 9,386,241, incorporated herein by reference. Within a spectrometer, the image sensor is a critical element for determining data sampling rates, optical bandwidth, optical signal detection sensitivity, optical signal-to-noise ratio performance, etc. Areal charge-coupled-devices ("CCDs") are most common but have multiple performance limitations and inhibit, among other aspects, highly desirable operating modes and rapid data rates. As described in U.S. Pat. No. 9,386,241, complex clocking, data shifting and reading may be performed to offset certain performance issues but, for example, the effects of multiple signal mixing, cross-contamination and slow data sampling rates remain due to the physical structure of the existing devices and required pixel shifting schemes.

SUMMARY

In one aspect, the disclosure provides a multimode configurable spectrometer. In one embodiment, the multimode configurable spectrometer includes: (1) an optical sensor configured to receive an optical input and convert the optical input to electrical signals, wherein the optical sensor includes multiple active pixel regions for converting the optical input to the electrical signals, and (2) conversion circuitry, having multiple selectable converting circuits, that is configured to receive and convert the electrical signals to a digital output according to a selected one of the selectable converting circuits.

In yet another aspect, the disclosure provides a method of operating a multimode configurable spectrometer. In one embodiment, the method includes: (1) converting an optical input to electrical signals employing at least one of multiple active pixel regions of an optical sensor, (2) providing the electrical signals to conversion circuitry having multiple selectable converting circuits, and (3) converting the electrical signals to a digital output via one of the selectable converting circuits.

In still yet another aspect the disclosure provides an optical monitoring system. In one embodiment, the optical monitoring system includes: (1) an optical interface configured to communicate light observed from a process chamber, (2) a multimode configurable spectrometer configured to receive the light from the optical interface as an optical input. The multimode configurable spectrometer including: (2A) an optical sensor configured to convert the optical input to electrical signals, wherein the optical sensor includes multiple active pixel regions for converting the optical input to the electrical signals, (2B) conversion circuitry, having multiple selectable converting circuits, that is configured to receive and convert the electrical signals to a digital output according to a selected one of the selectable converting circuits; and (2C) a sensor controller configured to, based on the optical input, set an operating mode of the optical sensor and select one of the selectable converting circuits to provide the digital output.

The disclosure also provides another embodiment of a multimode configurable spectrometer that includes: (1) an optical sensor including multiple active pixel regions for converting an optical input to electrical signals and a shift register for each of the multiple active pixel regions, wherein each of the active pixel regions are independently controllable, (2) conversion circuitry, including selectable converting circuits, configured to receive and convert the electrical signals to a digital output according to a selected one of the selectable converting circuits, wherein a unique set of at least four different selectable converting circuits are connected to each of the shift registers, and the at least four different selectable converting circuits include a circuit having a high speed analog-to-digital convertor, a circuit having a low speed analog-to-digital convertor, and a combining circuit, and (3) a sensor controller configured to change, based on a type of the optical input, an operating mode of the optical sensor and a selected one of the selectable converting circuits to provide the digital output.

BRIEF DESCRIPTION OF THE DRAWINGS

The features characteristic of the disclosure believed to be novel are set forth in the appended claims. The disclosure itself, however, as well as a mode of use, further objectives and advantages thereof, will be best understood by reference to the following detailed description of an illustrative embodiment when read in conjunction with the accompanying drawings wherein:

DETAILED DESCRIPTION

Figure 1:
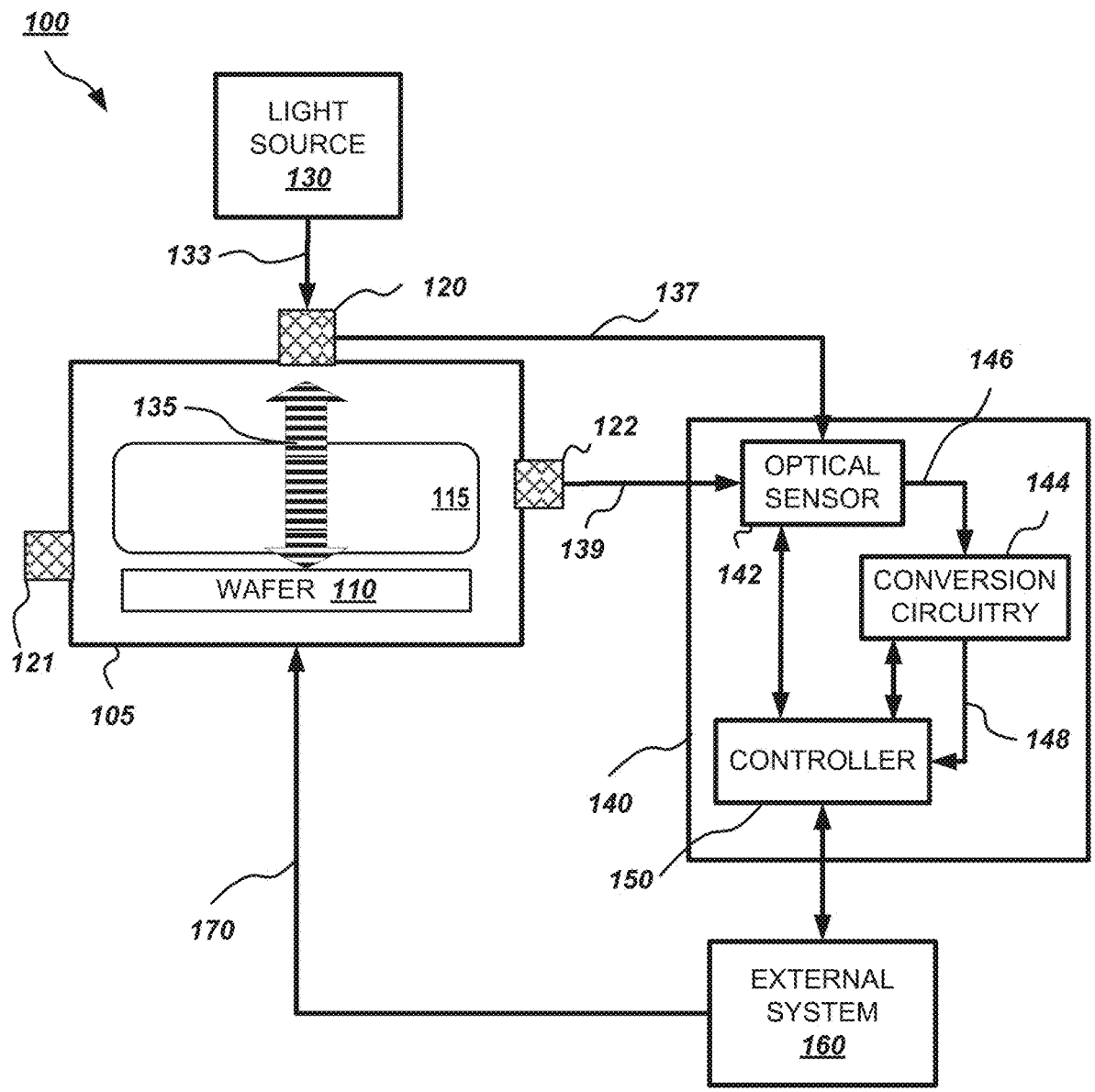
FIG. 1 is a block diagram of a system, including a multimode configurable spectrometer, for employing OES and/or IEP to monitor and/or control the state of a process within a semiconductor process tool, in accordance with the principles of disclosure.

In the following description, reference is made to the accompanying drawings that form a part hereof, and in which is shown by way of illustration, specific embodiments in which the features of the disclosure may be practiced. These embodiments are described in sufficient detail to enable those skilled in the art to practice the features of the disclosure, and it is to be understood that other embodiments may be utilized. It is also to be understood that structural, procedural and system changes may be made without departing from the spirit and scope of the disclosure. The following description is, therefore, not to be taken in a limiting sense. For clarity of exposition, like features shown in the accompanying drawings are indicated with like reference numerals and similar features as shown in alternate embodiments in the drawings are indicated with similar reference numerals. Other features of the disclosure will be apparent from the accompanying drawings and from the following detailed description. It is noted that, for purposes of illustrative clarity, certain elements in the drawings may not be drawn to scale.

With regard to monitoring and evaluating the state of a semiconductor process within a process tool, FIG. 1 illustrates a block diagram of process system 100 utilizing OES and/or IEP to monitor and/or control the state of a plasma or non-plasma process within a process tool. A semiconductor process tool 105 generally encloses a wafer 110 and possibly process plasma 115 in a typically partially evacuated volume which may include various process gases. Process tool 105 may include one or multiple optical interfaces 120, 121 and 122 that permit observation into the chamber at various locations and orientations. Optical interfaces 120, 121 and 122 may include multiple types of optical elements such as, but not limited to, optical filters, lenses, windows, apertures, fiber optics, etc.

For IEP applications, light source 130 may be connected with optical interface 120 directly or via fiber optical cable assembly 133. As shown in this configuration, optical interface 120 is oriented normal to the surface of wafer 110 and is often centered with respect to the same. Light from light source 130 may enter the internal volume of process tool 105 in the form of collimated beam 135. Collimated beam 135, upon reflection from the wafer, may again be received by optical interface 120. In common applications, optical interface 120 may be an optical collimator or alternatively may be a focusing system and collimated beam 135 is then focused instead of collimated. Following receipt by optical interface 120, the light may be transferred via fiber optic cable assembly 137 to multimode configurable spectrometer 140 for detection and conversion by optical sensor 142. Light source 130 may, for example, be a flashlamp producing light over the wavelength range from DUV to NIR and wavelengths of interest may be selected from any wavelength region therein. For larger substrates or where understanding of wafer non-uniformity is a concern additional normally oriented interfaces, not shown, may be used.

For OES applications, optical interface 122 may be oriented to collect light emissions from plasma 115. Optical interface 122 may simply be a viewport or may additionally include other optical elements such as lenses, mirrors and optical wavelength filters. Fiber optic cable assembly 139 may direct any collected light to multimode configurable spectrometer 140 and optical sensor 142 therein. Multiple interfaces may be used separately or in parallel to collect OES related optical signals. For example, optical interface 121 may be located to collect emission from near the surface of wafer 110 while optical interface 122 may be located to view the bulk of the plasma, as shown in FIG. 1. Other optical interfaces, not shown, may be located up/downstream of the plasma/wafer interface. Multiple interfaces may be coupled to individual fiber optic cable assemblies and direct multiple optical signals as a combined optical input to multimode configurable spectrometer 140 and optical sensor 142. Optical interfaces may also be simplified from those shown in FIG. 1 and essentially removed by direct mounting of multimode configurable spectrometer 140 to process tool 105.

In many semiconductor processing applications, it is common to collect and provide both OES and IEP optical signals to a spectrometer. Generally, it is not advantageous to support multiple spectrometers for each signal type due to cost, complexity, inconvenience of signal timing synchronization, calibration and packaging amongst other factors. Receiving and processing both types of these optical signals, however, can provide multiple problems for a single spectrometer. Typically OES signals are continuous in time whereas IEP signals may be either/both continuous or discrete in time. The mixing of these signals causes numerous difficulties as process control often requires the detection of small changes in both the OES and IEP signals and the inherent variation in either signal can mask the observation of the changes in the other. Further discussion of the optical signal detection difficulties and their mitigation by the disclosure are discussed below in association with FIGS. 6A-7C.

Advantageously, OES and IEP optical signals transferred via fiber optic cable assemblies 137 and 139, respectively, may be received as optical input at multimode configurable spectrometer 140 by optical sensor 142. Optical input, in general, may include one or more optical signals, such as the aforementioned OES and IEP signals and other continuous or discontinuous optical signals. Furthermore, it should be noted that any of the optical signals may be independent of or combined with other optical signals. Optical sensor 142 includes multiple active pixel regions for converting the optical input to electrical signals. Each active pixel region may therefore receive one or more optical signals. It should be understood that electrical signals within optical sensor 142 may be any of electrical charge signals, electrical current signals and/or electrical voltage signals depending upon the exact configuration of optical sensor 142. Commonly, the optical input is first converted to electrical charge which is then converted to electrical voltage and subsequently made available to devices external to optical sensor 142 via an output amplifier.

Multimode configurable spectrometer 140 may also include conversion circuitry 144, having multiple selectable converting circuits, that is configured to receive and convert electrical signals 146 to digital output 148 according to a selected one or more of the selectable converting circuits. Multimode configurable spectrometer 140 may further include a sensor controller 150 which may be configured to direct operation of optical sensor 142 and to select at least one of the selectable converting circuits of conversion circuitry 144 to provide digital output 148. Digital output 148 may be routed to sensor controller 150 for further processing, storage, etc., and/or may also be directly/indirectly transferred to external system 160 for further use.

External system 160 may be, for example, an industrial PC, PLC or other system which employs one or more algorithms to produce an output 170 such as an analog or digital control value that, for example, represents the intensity of a specific wavelength, the ratio of two wavelength bands, or a film thickness value. External system 160 may alternatively be integrated with multimode configurable spectrometer 140 to provide a more compact overall system. An OES algorithm analyzes emission intensity signals at predetermined wavelength(s) and determines control values that relate to the state of the process and can be used to access that state, for instance end point detection, etch depth, etc. For IEP applications, an algorithm may analyze an entire spectrum to determine a film thickness control value. For example, see "System and Method for In-situ Monitor and Control of Film Thickness and Trench Depth," U.S. Pat. No. 7,049,156, incorporated herein by reference. Output 170 may be transferred to process tool 105 via a digital or analog communication link such as Ethernet for monitoring and/or modifying the production process occurring within process tool 105. Although FIG. 1 specifically depicts a single process chamber of single process tool 105, it should be understood that multimode configurable spectrometer 140 may be advantageously used with multiple process chambers of single process tool 105 or with one or more process chambers of different process tools.

Figure 2:
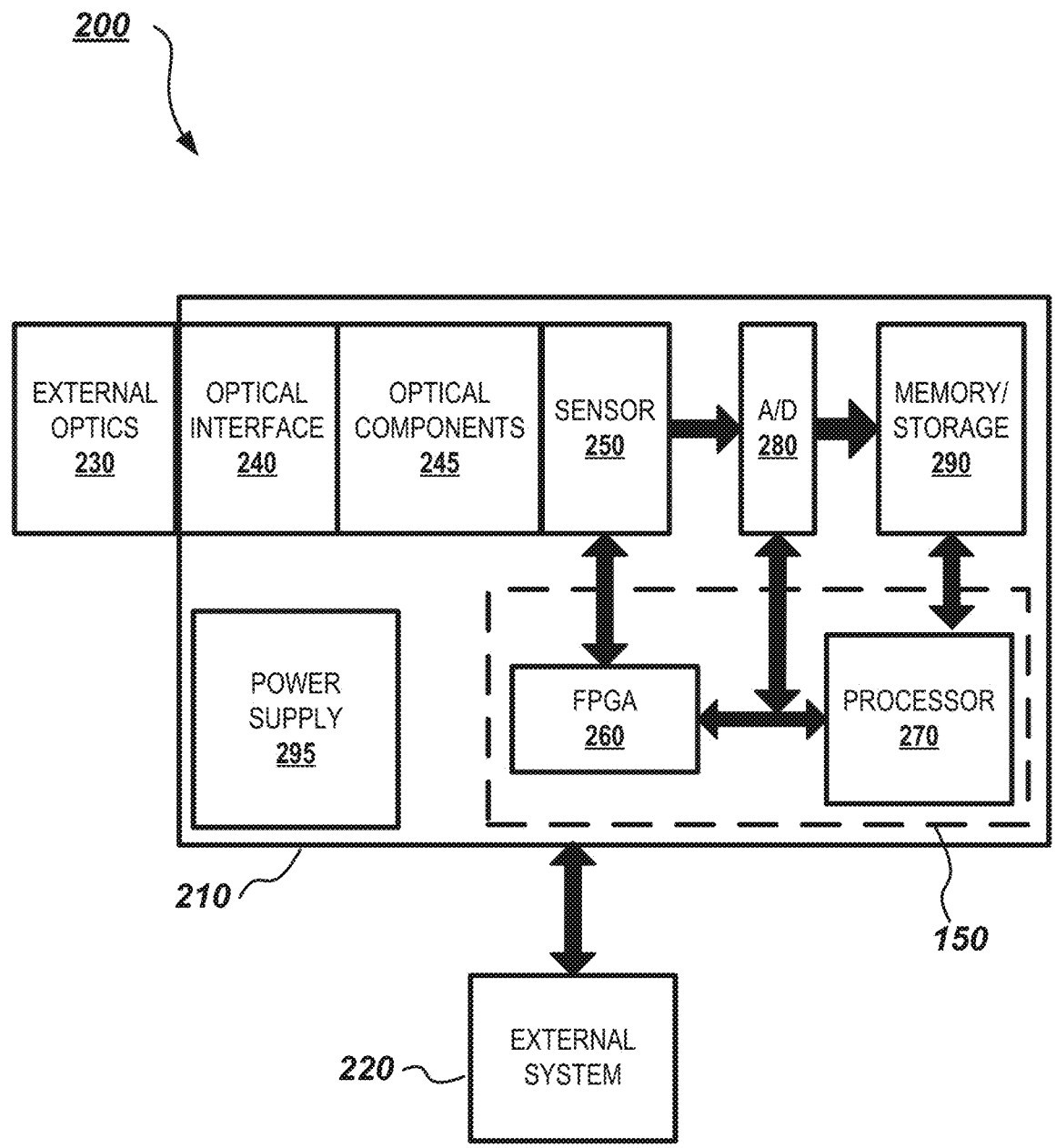
FIG. 2 is block diagram of a multimode configurable spectrometer and specific related systems, constructed in accordance with the principles of the disclosure.

FIG. 2 illustrates a block diagram of an embodiment of a system 200 including a multimode configurable spectrometer 210, in accordance with the principles of the disclosure. Multimode configurable spectrometer 210 may incorporate an optical sensor disclosed herein, described according to one embodiment illustrated in FIG. 3, to the advantage of the measurement of optical signals from semiconductor processes. Multimode configurable spectrometer 210 may receive one or more optical signals from external optics 230, such as fiber optic cable assemblies 137 and 139 of FIG. 1, and may, following integration and conversion of the optical signals, send digital output to an external system 220. External system 220 may also be used to control multimode configurable spectrometer 210 by, for example, selecting an operating mode or controlling a detail of an operating mode such as integration timing as defined herein.

Multimode configurable spectrometer 210 may include optical interface 240 such as an SMA or FC fiber optic connector or other opto-mechanical interface. Further optical components 245 such as slits, lenses, filters and gratings may act to form, guide and chromatically separate the received optical signals and direct them to optical sensor 250 for integration and conversion. Low-level functions of optical sensor 250 may be controlled by elements such as a programmable integrated circuit 260 and processor 270 which jointly may be associated with or part of sensor controller 150 of FIG. 1. The programmable integrated circuit 260 can be a field-programmable gate array (FPGA) and will be referred to hereinafter in the disclosure and the drawings as FPGA 260. The FPGA 260 can generate convertor control signals for A/D convertor circuits 280 and optical sensor clocking signals for optical sensor 250. Processor 270 can also generate the convertor control signals and the optical sensor clocking signals. Processor 270 can be various types of processors including computer processors having a reduced instruction set computing architecture. Other examples of processors that can be employed include processors from Intel and digital signal processors (DSP) such as from BlackFin. Following optical to electrical conversion within optical sensor 250, signals may be directed to A/D convertor circuits 280 and converted from electrical to digital signals. A/D convertor circuits 280 may be included as one of several converting circuits within conversion circuitry 144 of FIG. 1 and is discussed in further detail below in association with conversion circuitry of FIG. 3.

Digital signals from A/D convertor circuits 280 may then be stored in memory 290 for immediate or later use and transmitted to external system 220 (such as external system 160 of FIG. 1). Multimode configurable spectrometer 210 further includes power supply 295 that provides necessary voltages for operation of elements within multimode configurable spectrometer 210. The connections between the components of the system 200 and the multimode configurable spectrometer 210 can be conventional connections. Although certain interfaces and relationships are indicated by arrows, the multimode configurable spectrometer 210 can include additional interactions and control relations. Digital signals may include one or more values representative of the one or more optical signals included within the optical input to optical sensor 250. In general for spectrometers, digital signals commonly include digital representations of spectra. For example, a spectrum may include 1024 elements each of a digital type such as unsigned 16-bit integer.

Figure 3:
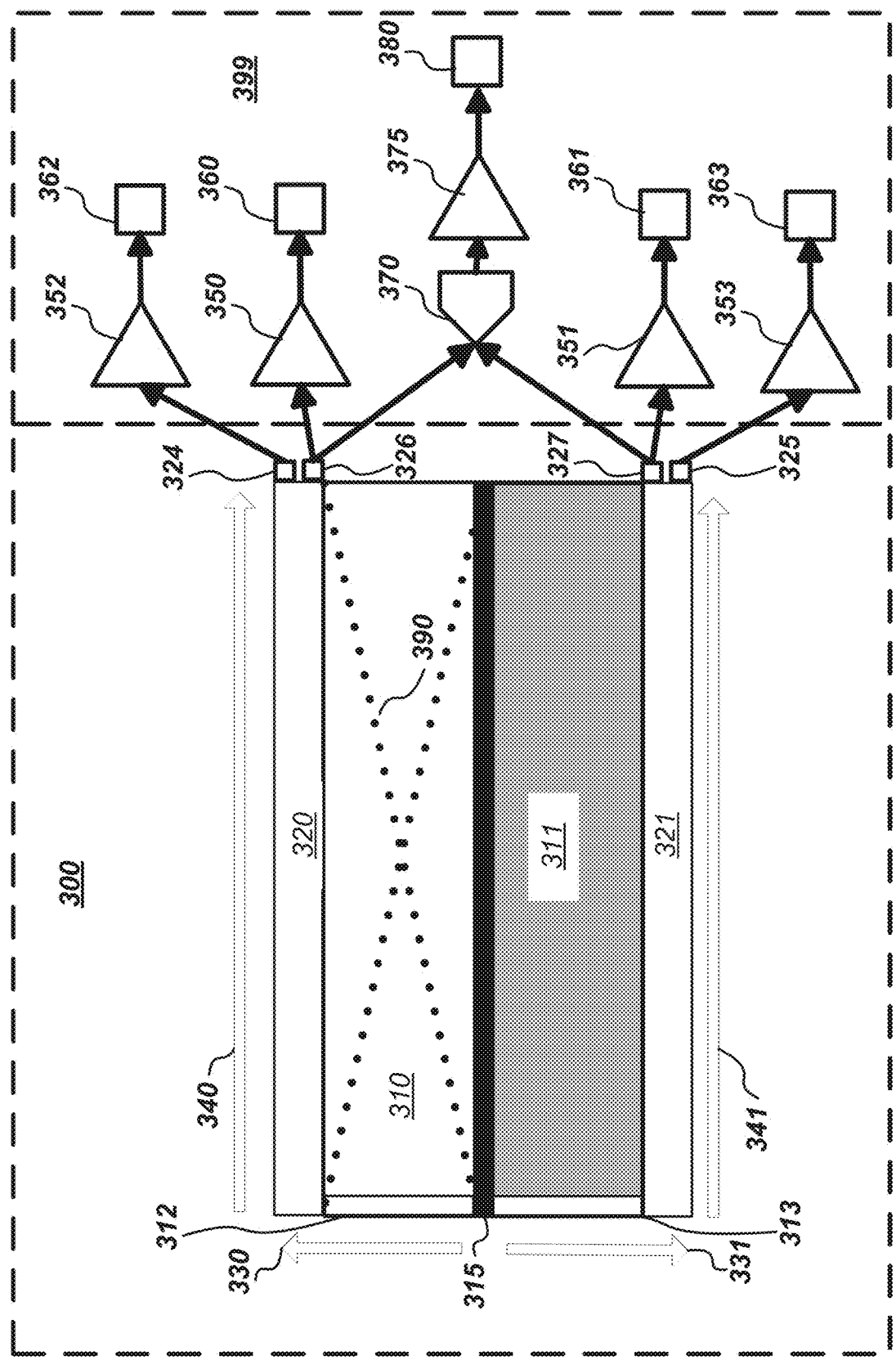
FIG. 3 is a schematic diagram which generally depicts the functional elements of a novel optical sensor and associated electronics for use with a multimode configurable spectrometer, in accordance with the principles of the disclosure.

To address the limitations of spectrometers and integrated imaging optical sensors of the prior art, a new configuration for an optical sensor is required. FIG. 3 is a schematic diagram which generally depicts the functional elements of an embodiment of a novel optical sensor 300 and associated conversion circuitry 399 useful for spectroscopy and semiconductor process control, in accordance with the principles of the disclosure. Optical sensor 300 generally includes multiple active pixel regions that may be dependently or independently controlled. As shown in FIG. 3 only two regions are shown and discussed for clarity but larger numbers of regions may be used for advantages described herein.

Herein the terms "horizontal" and "vertical" row(s) are used to describe internal geometry of optical sensor 300. It should be understood that this is a matter of convention where the "longer" or higher element count axis of the optical sensor is generally denoted as the "horizontal" direction. In spectroscopy applications it is common that the long/horizontal axis of the optical sensor is aligned with the orientation of the wavelength dispersion. Active pixel regions 310 and 311 of optical sensor 300 may each include a number (e.g., ~3000) of tall pixels (~2000 microns) in a single horizontal row. This configuration differs from the typical prior art optical sensor where many rows of shorter pixels, e.g., 128 rows of pixels with 24 micron heights are utilized. Tall pixels, on the order of 1000 to 4000 microns, are suitable for use in imaging spectrometer systems and are well matched to slit heights and imaging system magnifications near unity. A limited number of rows (e.g., 2-10) of pixels may, alternatively, be used but may further require additional vertical clocking operations which can slow the operation of optical sensor 300. Additional rows add the capability for each active pixel region to be spatially subdivided and may provide support for additional multiplexing (two or more optical signals per active pixel region) and control (ability to read all or any portion of the pixel rows of each active pixel region) of optical signals onto each active pixel area.

Although not required, an additional pixel region or physical gap 315 may be advantageously located between active pixel regions 310 and 311 of optical sensor 300 to provide optical and electrical isolation between regions 310 and 311. Physical gap 315 may be on the order of 10's to a 100 microns in width to ensure optical isolation of regions 310 and 311. Active pixel regions 310 and 311 may also include optically opaque regions 312 and 313 respectively which may be used for dark current/signal and DC offset compensation. Since such regions may be made optically opaque by a thick layer of silicon which may transmit NIR wavelengths, regions 312 and 313 are most effectively placed near the end of optical sensor 300 which UV wavelengths are expected to illuminate. Regions 312 and 313 may include, for example, two to four or more pixels supporting determination of average electrical offset levels. In FIG. 3 regions 312 and 313 are shown at an end of the active pixel regions opposite to the connections to the conversion circuitry. The location of these opaque regions and the orientation of the connections to the conversion circuitry may be varied per the requirements, such as pin-out design, of the actual semiconductor design of optical sensor 300.

In the case where regions 310 and 311 each include a single row of pixels, a single vertical shift transfers, as indicated by arrows 330 and 331, the integrated electrical signals from the active pixel regions 310 and 311 to their respective horizontal shift registers 320 and 321. The shifting of one region "up" and the other region "down" is a simplification of the drawing and possibly the actual semiconductor architecture. To provide capability to shift all in one direction the signal routing would be more complex. In the case of three regions, the signals from the center region would have to be routed under or around the two other regions. Furthermore, if each/any region 310 and 311 has more than one row of pixels multiple shifts are required. Additionally, vertical shifts for each of the multiple active pixel regions or individual row thereof may be synchronized, interleaved or simultaneous. Compared to existing CCDs, the optical sensor configuration results in faster and simpler clocking and there is no need to shift charge between overlapping integration regions whereby avoiding a primary source of optical signal contamination. In one example, the combination of active pixel regions and horizontal shift registers of optical sensor 300 support a full well capacity of 300-400 thousand electrons, a signal linearity of 5% or less and a signal dynamic range of greater than 14,000.

Subsequent to the vertical shifts, electrical signals in horizontal shift registers 320 and 321 may be horizontally shifted, as indicated by arrows 340 and 341 respectively, to respective high speed A/D convertors 350 and 351 and/or respective low speed A/D convertors 352 and 353 located on associated conversion circuitry 399. The ability to include and select between low speed and high speed A/D convertors permits selection for either fast read-out speed (high speed A/D) or low noise (low speed A/D). Multiple clock speeds and pixel sampling techniques may be available for each of the high speed and low speed A/D convertors. Furthermore, clock speeds may be dynamically changed to optimize the conversion of electrical signals from optical sensor 300 for a particular operating mode. In general, the combination of optical sensor 300 and conversion circuitry 399 provide operating modes supporting trade-offs between data rate (e.g., spectra/sec), additional digital resolution, and signal-to-noise ratio performance. Specifically, conversion circuitry 399 may be configured to multisample or oversample the electrical signal waveforms from a shift register in regions commonly defined as "DC/ref level" and "Signal level" to produce a differential digital signal depending upon A/D convertor clock speed, a desired signal-to-noise ratio performance, and a data sampling rate (per spectrum).

In association with high speed A/D convertors 350 and 351 and/or respective low speed A/D convertors 352 and 353, optical sensor 300 may include dual outputs for each horizontal shift register. Specifically, output 324 may be a low speed and low noise output associated with shift register 320 and connected to convertor 352; and output 325 may be a low speed and low noise output associated with shift register 321 and connected to convertor 353. Furthermore, output 326 may be a high speed output associated with shift register 320 and connected to convertor 350; and output 327 may be a low speed and low noise output associated with shift register 321 and connect to convertor 351. Although combining function 370 is shown connected with outputs 326 and 327, outputs 324 and 325 may be substituted. Horizontal shift registers 320 and 321 and associated elements of conversion circuitry 399 may be clocked synchronously or asynchronously and each converter may operate at independent selectable clock speeds. Synchronous clocking provides simultaneous parallel signals from each active pixel region whereas asynchronous clocking may be used to support interleaving of signal from the active pixel regions. Optical sensor 300 and conversion circuitry 399 may achieve high speed operation of one millisecond per spectrum per active pixel region using suitable 18-bit A/D converters and result in digital signals with high dynamic range, e.g. 100 dB. To support such high data sampling rates (e.g., spectra/sec), the FPGA 260 and the processor 270 of FIG. 2 can provide data compression and other high speed signal processing; this can be performed before data is transmitted for further processing by, for example, external system 220. Representatively, high speed operation allows for measuring very strong optical signals and low noise (slow speed) operation allows for measuring very weak optical signals, and hence the combination enhances the overall system dynamic range.

Following conversion, digital signals may be available at ports 360, 361, 362, and 363 and transmitted to elements described in FIG. 2 such as memory 290, processor 270 and FPGA 260. Alternatively, signals from horizontal shift registers may be directed to a combining function, for example combining circuit 370, and then converted, by A/D convertor 375, and made available at port 380. A/D convertor 375 may be either the low or high speed type or conversion circuitry 399 may include selectable low/high speed A/D convertors for a signal arising from combining circuit 370. Combining circuit 370 may include a summing circuit, a differencing circuit, a dividing circuit, a multiplying circuit, or an interleaving circuit, and may be a single element configured to perform the function of one of these combining circuits.

Any signal paths from horizontal shift registers 320 and 321 to respective A/D convertors may be selected as desired by the generated convertor control signals and optical sensor clocking signals provided by, for example, the FPGA 260 or the processor 270. Selecting via the convertor control signals can be by, for example, electrically enabling or disabling circuits or opening/closing switches. The configurability of optical sensor 300 and conversion circuitry 399 permits multimode adaptable use of the sensor such as signal summing for increased dynamic range or averaging, signal differencing for common mode correction and change detection, and parallel independent signals. Although shown in FIG. 3 as part of conversion circuitry 399, any of the various depicted A/D convertors and combining circuit 370 may be integrated with optical sensor 300. For example, combining circuit 370 may be performed in the analog domain within optical sensor 300 or within conversion circuitry 399. Best signal performance may be expected with combining done on optical sensor 300. Furthermore, combining circuit 370 may be performed in the digital domain within, for example, sensor controller 150 of FIG. 1 but is then subject to A/D quantization and digital mathematical error. Although in FIG. 3, all convertors and outputs are shown connected at a single end of optical sensor horizontal shift registers 320 and 321; it should be understood that convertors and outputs may be conveniently place at either/both ends of the shift registers. In certain layouts, having the different outputs at each end of shift registers 320 and 321 provides a benefit of removing the need for switching components internal to optical sensor and electrical signal outputs may be simply directed by change of the phasing of clocking signals to optical sensor 300. Conversion circuitry 399 may, like conversion circuitry 144 of FIG. 1, be directed by a subsystem of a multimode configurable spectrometer such as sensor controller 150 of FIG. 1. The sensor controller 150 can generate the convertor control signals and the optical sensor clocking signals based on a selected operating mode that, for example, can be received from the external system 220. The FPGA 260 or the processor 270, for example, can be programmed to generate the convertor control signals and the optical sensor clocking signals to enable and disable different operating modes and configurations of the optical sensor 300 and the conversion circuitry 399.

Active pixel regions 310 and 311 of optical sensor 300 may further include the integration of a high speed (millisecond timing) electronic shutter function. This function 390 is represented in FIG. 3 via dotted "X" displayed over active pixel region 310. Electronic shutter function 390 may inhibit/permit the integration of charge due to exposure of the sensor in any whole or partial active pixel region of optical sensor 300. For example, shutter control may vary independently along the horizontal axis of optical sensor 300. The spatial and temporal control of the shutter function 390 as part of an operating mode of optical sensor 300 and an associated spectrometer, such as multimode configurable spectrometer 140, may support enhanced dynamic range, gain flattening, high speed synchronization of optical signals collected from external controls such as for a pulsed plasma, moving or transient system, and the ability to monitor high frequency modulated or rapidly changing source emissions without aliasing. Electronic shutter function 390 may be controlled, for example, via a controller, such as sensor controller 150 of multimode configurable spectrometer 140 of FIG. 1.

Figure 4:
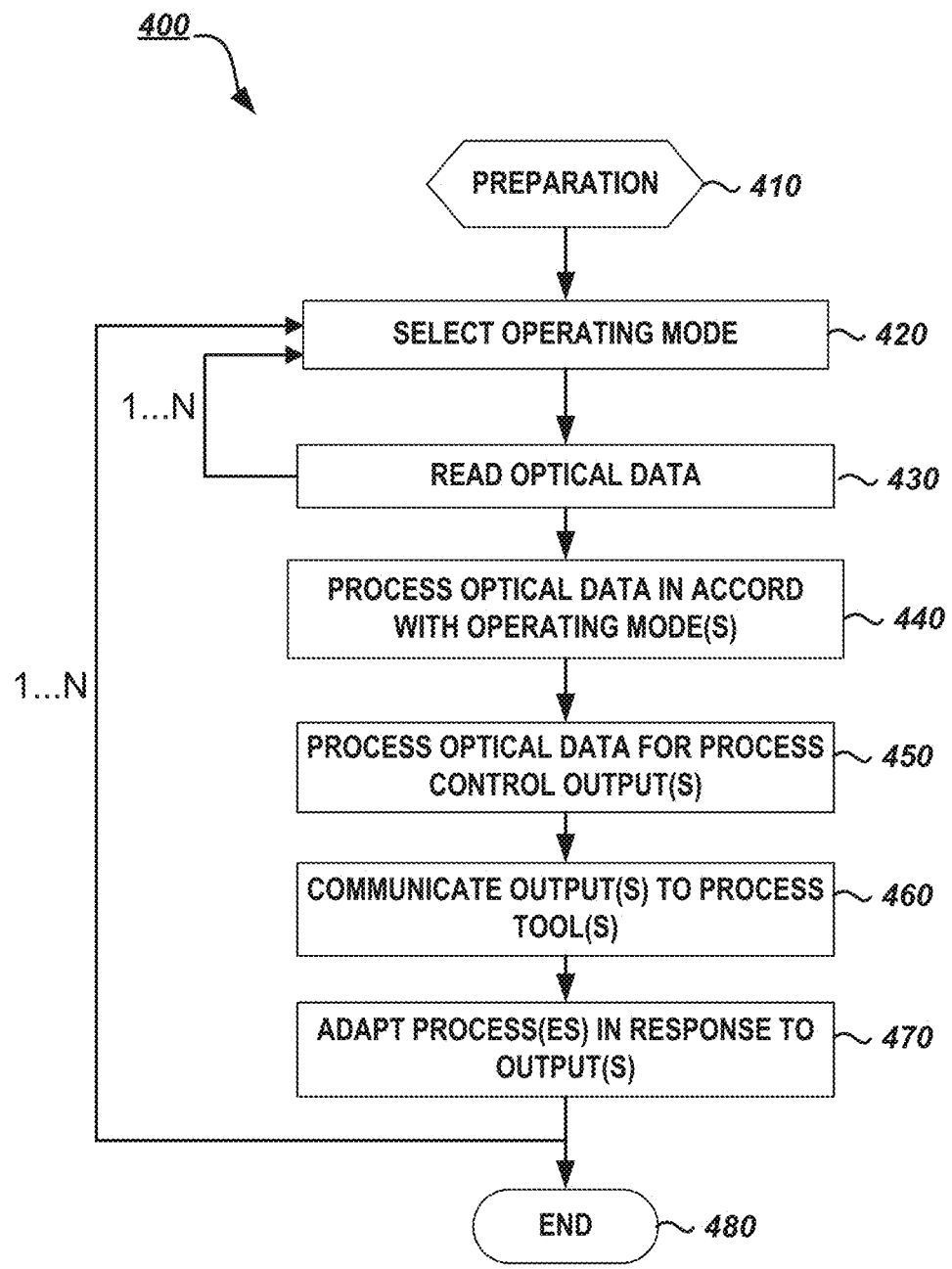
FIG. 4 is a flow chart for a method of reading optical data from a multimode configurable spectrometer including a novel optical sensor, such as shown in FIG. 3, carried out in accordance with the principles of the disclosure.

FIG. 4 is a flow chart for an example of a process 400 of reading optical data from a multimode configurable spectrometer including an optical sensor and conversion circuitry, such as shown in FIG. 3. Herein, optical data may be associated with any of the multiple states of the optical input to the spectrometer including optical signals and converted electrical/digital signals. Process 400 initiates with preparation step 410 wherein operating modes, semiconductor process types, integration times and other initial parameters may be predetermined. Next in step 420 selection may be made of the predetermined operating mode of the spectrometer, the included optical sensor and the conversion circuitry. An operating mode may include, for example, settings and parameters for converting circuit selection, combining function selection, active area optical signal integration times, digitization schemes for maximizing dynamic range, and shutter function timing. An operating mode may be defined within an external system, such as external system 160 of FIG. 1, conveyed to a multimode configurable controller, such as sensor controller 150 of multimode configurable spectrometer 140 of FIG. 1, and then specifically controlled by the controller, such as by FPGA 260 and processor 270 of FIG. 2. An operating mode may be defined with respect to the conditions and requirements of specific semiconductor processes and data requirements as discussed below in association with Table 1. For example, an operating mode may include settings and parameters based upon types of optical connections, optical signal types (OES/IEP), levels (bright/dim) and temporal variation (continuous/pulsed). An operating mode may also be based on processing system optimization, such as to support optical data from separate sources that result in independent and asynchronous digital signals for each source.

Next in step 430 data may be read, as discussed in association with FIGS. 1-3, from an optical sensor, conversion circuitry and multimode configurable spectrometer as defined by the operating mode. Steps 420 and 430 may be repeated multiple times (1 . . . N) to provide optical data with characteristics useful for process applications. For example, a certain operating mode may instruct the optical data to be read to provide a digital output of two digital signals of OES data where a first digital signal may be collected from active pixel region 310 and a second digital signal may be collected from active pixel region 311. Additional parameters of the operating mode may include selection of combining circuit 370 as a summing circuit and the selection of a low speed A/D convertor for improved signal-to-noise ratio performance. In a slightly modified operating mode, where the optical input to active pixel region 310 is much greater than that of active pixel region 311, the shutter function or other timing control may be applied to active pixel region 310 for a portion of the integration period to reduce the amount of accumulated electrical signal. Step 430 may be performed multiple times prior to process 400 returning to step 420. Furthermore, the selecting of operating mode during step 420 may be adapted dynamically in real-time during the semiconductor process that is generating the optical input based upon certain parameters of the digital signals or upon externally supplied command. For example, if digital signals indicate saturation of the optical sensor, the operating mode may be adjusted to reduce the integration time of the optical signal received by an associated active pixel area. The reduction may be performed by either altering the integration time of the active pixel region directly or adjusting the time of an associated shutter function. Operating mode adjustment may be directed by, for example, processor 270 of FIG. 2 or external system 160 of FIG. 1. Furthermore, dynamic adjustment of operating mode may require at least one cycle of process 400 steps 420 through 470 prior to adjustments being enacted.

Next in step 440, the collected optical data may be processed in accord with the operating modes on the multimode configurable spectrometer and optical sensor. For example, if the multimode configurable spectrometer is used in an operation mode with a flashlamp where alternating illumination is used, processing may include the determination of differences between when optical data illumination is on and when off. Processing may be performed by, for example, combining circuit 370 of FIG. 3, processor 270 of FIG. 2 or external system 160 of FIG. 1. Subsequently, in step 450, the optical data may be processed for reduction and extraction of control value outputs that may be communicated to the process tool in step 460. Determination of control value outputs may be performed by, for example, processor 270 of FIG. 2 or external system 160 of FIG. 1. Output(s) generated in step 450 and received by a process tool, such as process tool 105 of FIG. 1, may be used in step 470 to adapt the operation of the process occurring within the tool and acting upon a wafer. Process 400 may terminate in step 480 and wherein optical data and calculated values may be stored for later retrieval, etc. Process 400 may define optical data as points or spectra in a time series covering the length of the monitored/controlled process which may be from a few seconds to tens of minutes typically and include optical data collected as frequently as one millisecond and as long as several minute intervals.

Figure 5:
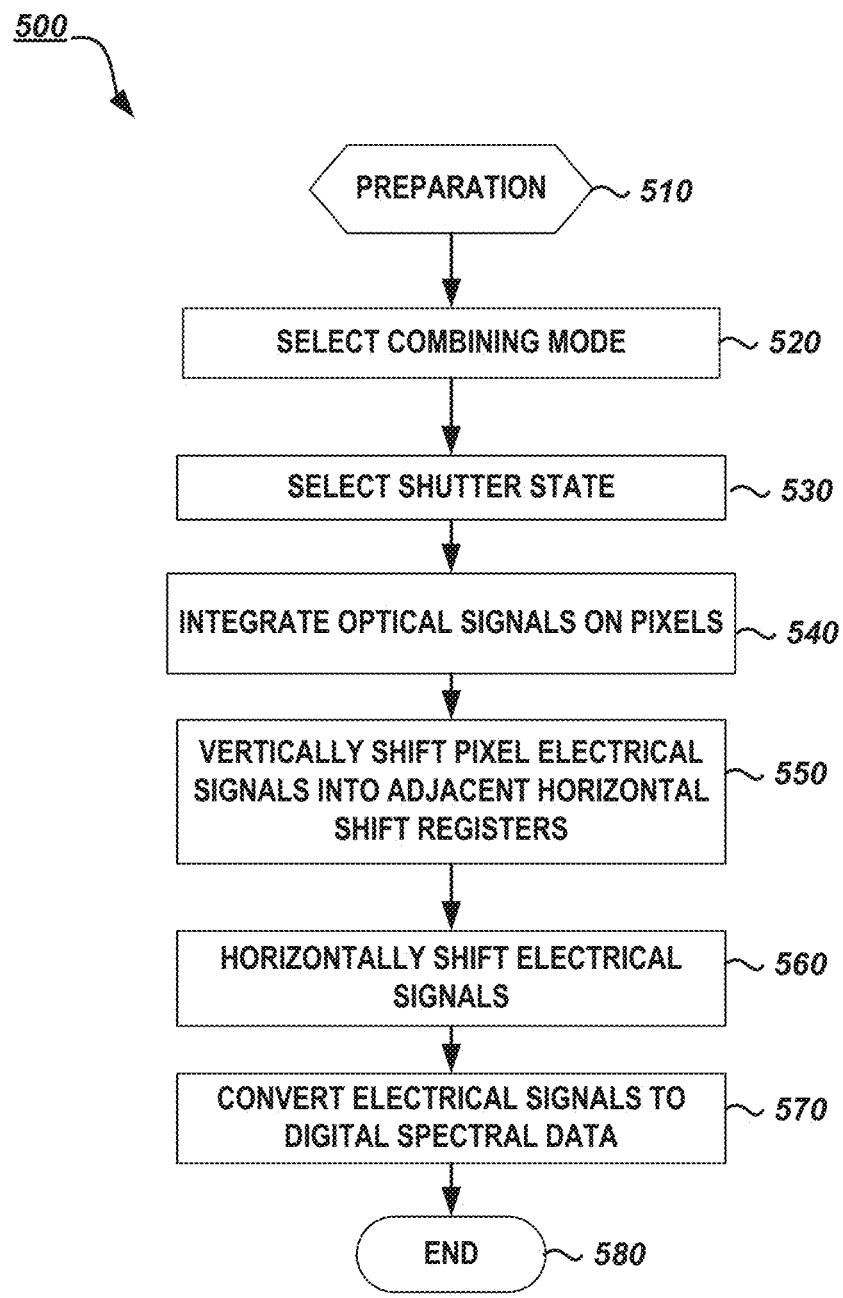
FIG. 5 is a second flow chart for a method of reading optical data from a multimode configurable spectrometer including a novel optical sensor, such as shown in FIG. 3, carried out in accordance with the principles of the disclosure.

FIG. 5 is a second flow chart for a process 500 of reading converted optical data from a multimode configurable spectrometer including an optical sensor, such as shown in FIG. 3, in accordance with one embodiment of the disclosure. Process 500 adds further details to process 400 regarding internal operation of the multimode configurable spectrometer, the optical sensor and conversion circuitry. Process 500 starts with preparation step 510 wherein actions such as controlling FPGA functions may be defined or setup or initialization checks for a multimode configurable spectrometer may be performed. In step 520 a selection of the combining mode of the multiple outputs of the optical sensor may be selected. In step 530 the state and timing of the shutter for the optical sensor may be selected. Shutter function may, for example, be applied to any of the active pixel regions individually to control exposure between different brightness sources while allowing a consistent use of overall spectrum (digital signal) data rate from each active pixel region. Following shutter state selection optical signals may be integrated for a predetermined amount of time in step 540. The integration time may be the same or vary for each active pixel region of an optical sensor. Furthermore, under some operating modes, the integration times and signal processing for each active pixel region may be asynchronous to support interleaving or fully independent optical data collection as may be required when a multimode configurable spectrometer and optical sensor is used with multiple independent process tools or process chambers.

Next, in step 550 integrated charge may be vertically shifted to adjacent independent horizontal shift registers. Next, in step 560 the electrical signals in the horizontal shift registers may be horizontally shifted and converted, in accordance with the preselected combining mode and data sampling rate setting of the operating mode. In step 570 electrical signals may be converted to digital signals that define collected spectra in accordance with selected converting circuits and convertor sampling rate and oversampling of the conversion circuitry. Process 500 ends with step 580 wherein optical data may be stored or applied, for example, as described in association with process 400 and/or FIG. 1.

Table 1 highlights the benefits, based upon signal types, of certain operating modes of the optical sensor, conversion circuitry, and multimode configurable spectrometer, in accordance with the principles of the disclosure. Operating modes of a multimode configurable spectrometer may be closely associated with the semiconductor signal types that are to be monitored. Specifically, these signal types as mentioned previously are OES and IEP signals. Examples of which are shown and described in association with FIGS. 6A-7C. Considering an optical sensor, such as sensor 300 of FIG. 3, with two active pixel regions and additionally considering operating modes of independent parallel reading and summed/difference reading of the optical data from the active pixel regions; specific benefits may be observed over existing spectrometer systems.

Figure 6A:
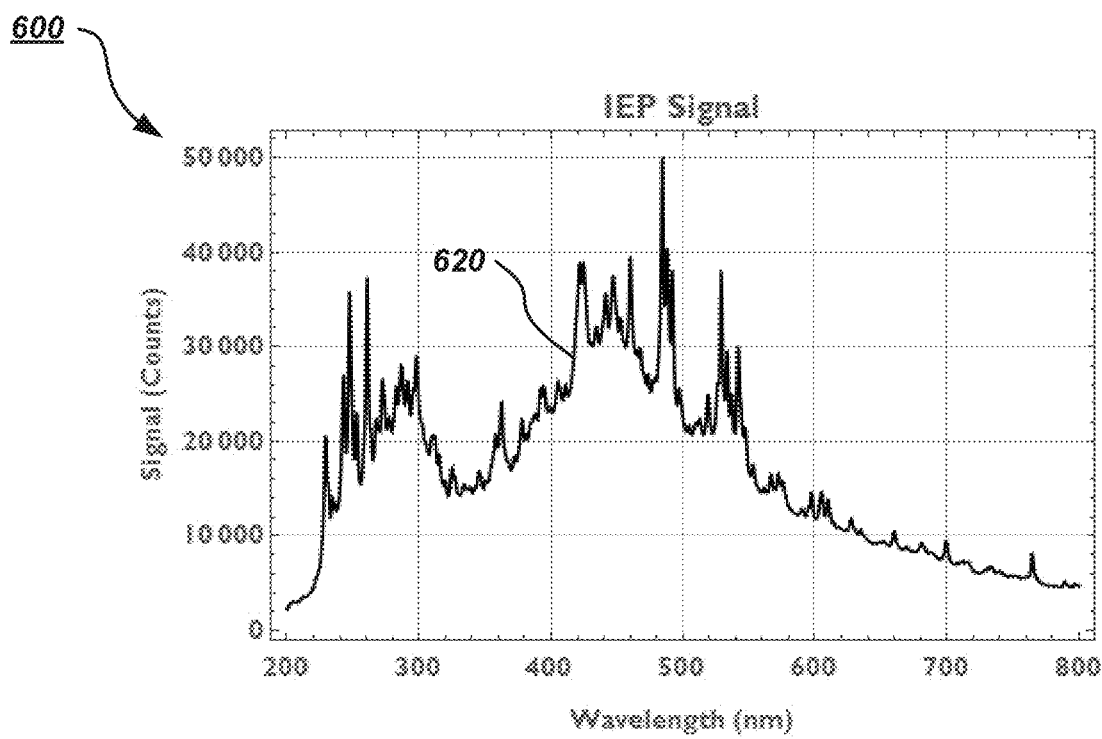
FIG. 6A is a plot of a representative IEP optical signal (spectrum)
Figure 6B:
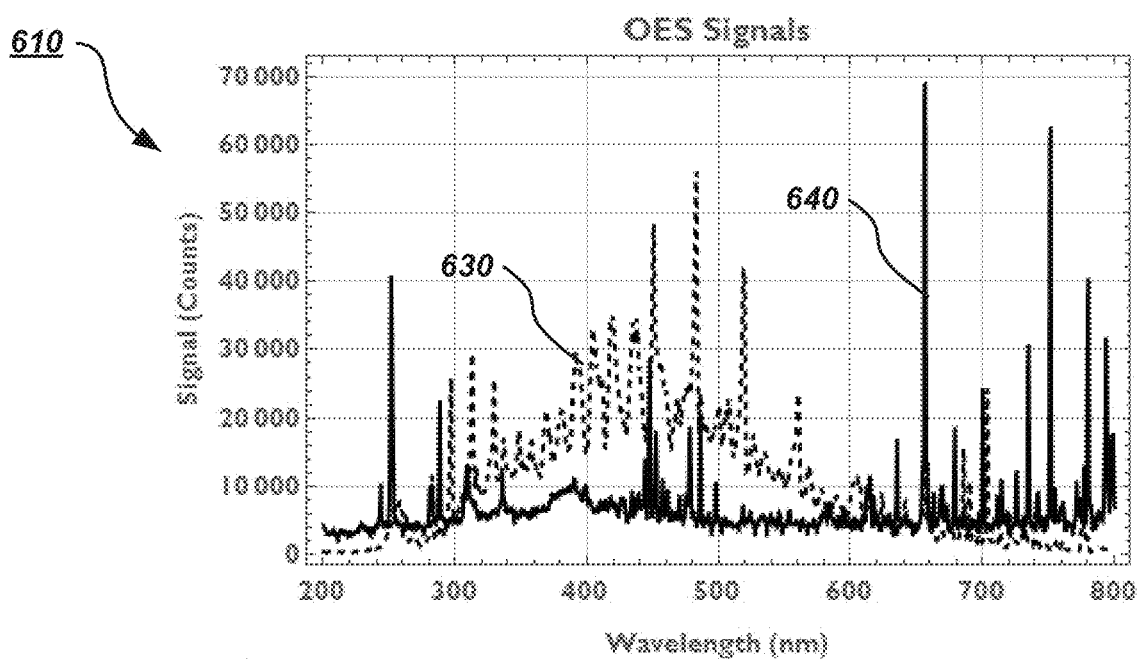
FIG. 6B is a plot of multiple representative OES optical signals (spectra)

Turning now to representative plots of OES and IEP optical data, FIG. 6A is a plot 600 of a typical IEP optical signal (spectrum) 620 from a Xenon flashlamp reflected from a wafer. Although as discussed herein IEP signals are considered as pulsed or discrete optical signals such as produced by flashlamps, it should be understood that IEP signals may be time continuous or discrete. A pulsed optical signal may vary between two or more levels of light level at a defined pulse rate and duty cycle, such as 10 times per seconds at 50% duty cycle. The emphasis herein is to provide contrast with typically time continuous OES optical signals which maintain a generally constant optical signal level over a time period of interest. Whereas, pulsed optical signal arising from flashlamps are typically of very short duty cycle or duration often a few microseconds and often have 100% modulation depth; pulsed optical signals arising from pulsed plasma are more variable and often do not have 100% modulation depth of the optical signal. Flashlamp signals for IEP are also generally broadband in wavelength and can vary considerably over the wavelength range. FIG. 6B is a plot 610 of multiple typical OES optical signals (spectra) 630 and 640. Spectrum 630 shows features typical of both molecular (broadband structure near 400 nm) and atomic emissions (narrow peaks throughout). Spectrum 640 shows features more exclusively of atomic emissions and the signal level as a function of wavelength is observed to change from near zero counts to near 70,000.

IEP and OES spectra collected in multiple regions of a single active pixel region of an optical sensor within a spectrometer may vary greatly in amplitude, may be resultant from different chambers or different locations in the same chamber. For many current semiconductor processing application, small signal (or small signal change) detection is critical, and important optical signal features may be hidden when reading existing spectrometers since contamination, cross-talk, limited dynamic range, and other problems exist with current optical sensor and spectrometer technologies.

As mentioned in the previously referenced U.S. Pat. No. 9,386,241, multiple problems are present with the use of these existing optical sensors and spectrometers. A primary problem is that active pixel area acts as a circular buffer and signals integrated in various portions of the active pixel area, typically, must pass through other portions which may remain exposed during shifting and become contaminated. The resultant optical signal being combinations of the signals incident upon the different portions in various proportions based upon shifting rates, etc. Additionally as the rows are shifted from one portion to another, original portions of the sensor may continue to be exposed and may integrate undesired signals. Again as mentioned in the previously referenced U.S. Pat. No. 9,386,241, considerable effort has been applied to combat these problems and others at the cost of adding more complexity and providing lower data rates and additional signal reads. Specific attention may be given to FIG. 12 of U.S. Pat. No. 9,386,241 where to avoid certain contamination of multiple integrated signals, a portion of the active region of the optical sensor is obscured and a complex arrangement of row shifts and horizontal reads may be performed to accommodate the limitations of the existing imaging spectrometers.

Figure 7A:
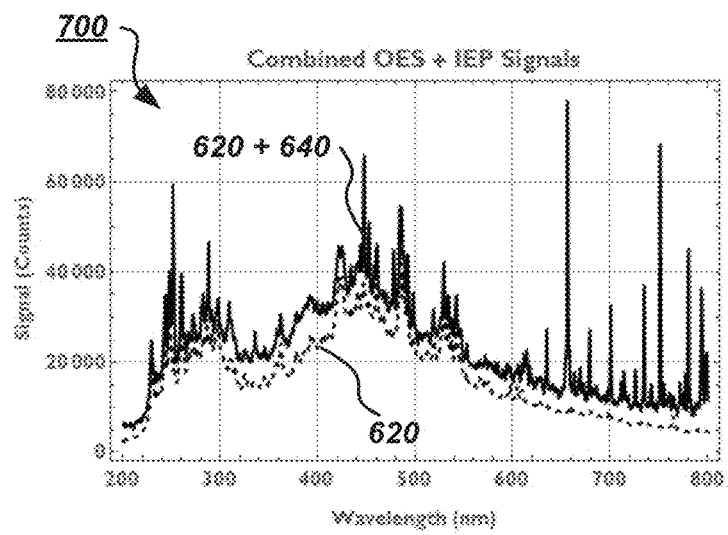
FIG. 7A is a plot of a representative IEP optical signal combined with a first OES optical signal.
Figure 7B:
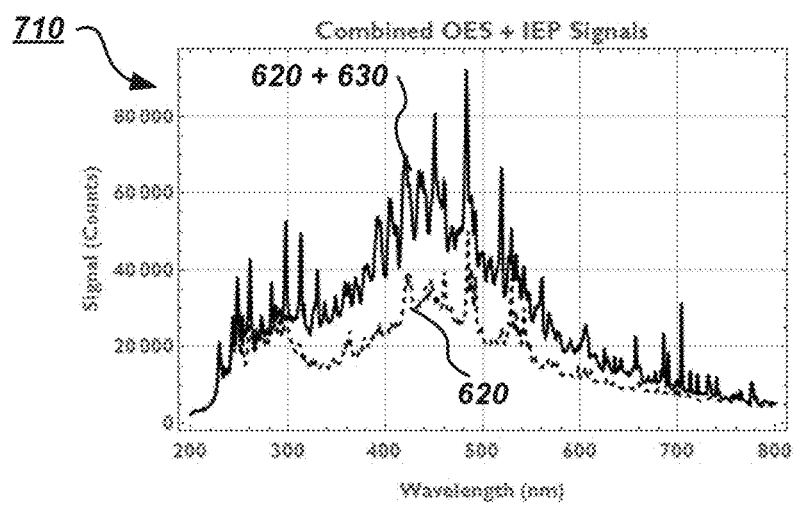
FIG. 7B is a plot of a representative IEP optical signal combined with a second OES optical signal.

The aforementioned problems may be represented by review of semiconductor processing applications where IEP and OES signals may be combined when observed. FIG. 7A is a plot 700 of typical IEP optical signal 620 combined with OES optical signal 640. Here it is shown that the desired IEP signal is impacted by the contamination from the OES signal but that the overall characteristic shape of the IEP is evident. FIG. 7B is a plot 610 of the same typical IEP optical signal 620 combined with a second OES optical signal 630. Here it is shown that much greater contamination of the desired IEP optical signal and an overall reduction in the ability to discriminate between the original signals due to a division of dynamic range. Significantly the appearance of fringe-like wavelength intensity patterns in the OES signal can be interpreted in the contaminated IEP signal as indicating reflectance from a material layer.

Flashlamps may be used in "dual read" modes with the flashlamp pulse alternatively on and then off (for example, see U.S. Pat. No. 6,160,621, included herein by reference) to remove considerable amounts of the signal contamination, but this operating mode assumes a sufficiently slowly changing OES signal. If the OES signal is not sufficiently static, uncontaminated determination of the IEP signal is not possible with existing systems. Utilizing the optical sensor and spectrometer of the disclosure, an active pixel region receiving an pulsed IEP flashlamp signal may be gated using the shutter function or other operating mode setting to exclude the integration of received optical input from a time period other than the few microseconds duration of the optical pulse.

Figure 7C:
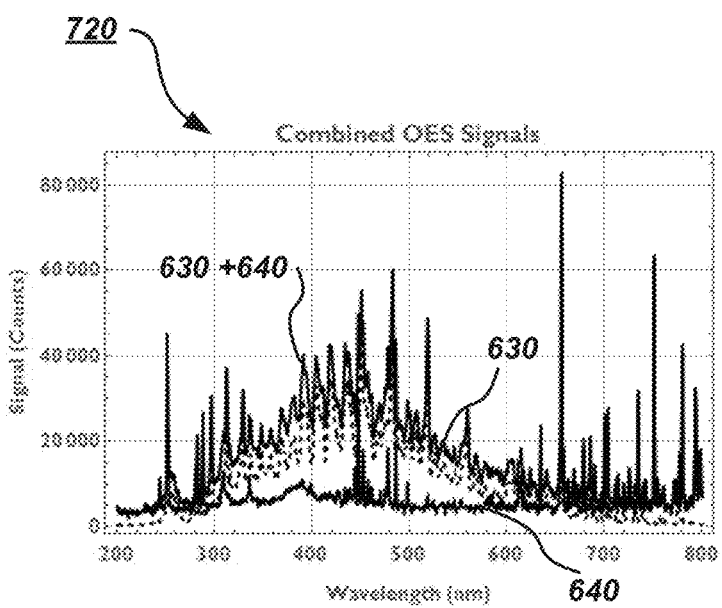
FIG. 7C is a plot of a first representative OES optical signal combined with a second OES optical signal.

FIG. 7C is a plot of a first typical OES optical signal 630 combined with a second OES optical signal 640. These signals may arise, for example, from optical interfaces 121 and 122 of FIG. 1. Here it is shown that the characteristics of signal 640 are mostly obscured by the presence of signal 630. As OES signals are typically continuous in time, the limitations of the physical read-out structure of existing spectrometers and optical sensors always produce contamination of the signals. Again contamination on the level of sub-one-percent is sufficient to make certain processes inoperable as open areas for processes are very low. For example, a semiconductor etch process with one percent open area may require endpoint detection accuracy of one percent. These combined requirements suggest the need to detect changes on the order of 1:10,000, and any optical signal contamination needs to be less than this amount. The operation of the optical sensor and the multimode configurable spectrometer of the disclosure greatly reduces or completely removes the contamination of reading the combined OES signal and permits individual determination of optical signals 630 and 640.

The multimode configurable spectrometer of the current disclosure provides flexibility of operation regarding optical signal observation location, single/multiple chamber integration, single/multiple processing tool integration, single/multiple process variation, signal type variation, and relative timing/synchronization of any of the aforementioned. A few specific examples are described in Table 1. Descriptions of modes and benefits listed in Table 1 are not meant to be exhaustive and benefits associated with any certain operating mode or signal type may also be associated with other operating modes or signal types.

TABLE 1

| Signal Type in First Active Region | Signal Type in Second Active Region | Potential Benefit(s) using Configurable Spectrometer |
| --- | --- | --- |
| OES | OES | Simultaneous independent OES measurement without cross contamination from multiple sources/locations/wafers/chambers. Equal data intervals but independent integration times with shutter function. Simultaneous sum/average/difference/ratio of OES signals from multiple sources/locations/wafers/chambers. High dynamic range ("HDR") optical data may be assembled by combining optical data from multiple reads of a single active pixel region or from reads from separate active pixel regions in combination with the dual modes of high speed and low-noise operations modes. |
| OES' | OES" | Similar to above except asynchronous OES measurement without cross contamination. Equal or unequal Integration and Equal or unequal Data intervals |
| IEP | IEP | Simultaneous independent IEP measurement without cross contamination. Simultaneous independent measurement of an IEP and an associated IEP reference signal with may be further processed using the combining function. |
| IEP' | IEP" | Similar to above except asynchronous IEP measurement without cross contamination. Equal or unequal Integration and Equal or unequal Data intervals |
| OES + IEP | OES + IEP | Isolation of pulsed IEP signal from continuous OES signal using synchronized shutter function and differencing function between optical signals from multiple active pixel regions. |

TABLE 1-continued

| Signal Type in First Active Region | Signal Type in Second Active Region | Potential Benefit(s) using Configurable Spectrometer |
|---|---|---|
| OES + IEP | OES | Isolation of IEP signal from combined signals using differencing function between optical signals from multiple active pixel regions. May not require use of alternating strobe. Double data rate possible over existing techniques. |
| OES | IEP | Independent integration times and masking of discontinuous IEP signal from OES signal using shutter function. |
| OES + IEP | IEP | Second IEP signal may be used for normalization and referencing o fcombined IEP + OES signal. |

The signal types and benefits described in Table 1 may be associated with specific structure and functionality of the optical sensor and multimode configurable spectrometer of the current disclosure. For example, in dual OES mode (first row of Table 1) low signal cross-talk and contamination is achieved by the existence of dual shift registers and separate electrical signal outputs and conversion circuits. Other associations may be drawn from the descriptions herein and a few are described in further detail below.

In another example, the multimode configurable spectrometer of the current disclosure provides improved performance in the operating mode where one or more OES, IEP, or combined IEP and OES signals are monitored and when the overall light level is extremely high. Current practice is to use the shortest integration time compatible with the reading of the signals from the optical sensor and to subdivide the reading of the rows of the active pixel region such that a portion of the active pixel region is small. This results in a complex and slower operation of the spectrometer where multiple reads of the signal are performed and can result in signal being read but then not used due to saturation. The multimode configurable spectrometer of the current disclosure allows the shutter function to make the charge accumulation time short enough so saturation doesn't occur. Meanwhile, the data sampling rate may remain low enough to allow for high-quality digitization of the data whereby increasing overall signal-to-noise ratio and enhancing small signal detectability.

Relatedly, when it is desirable to be able to have different integration times for the two different optical signals, the combination of the shutter function and the independent readout of the active pixel regions is beneficial. In one example for OES, Argon and halogen emissions produce high intensity signals in the 700-800 nm spectral range; while emissions from by-products are generally weak and fall in the UV-VIS range. The multimode configurable spectrometer may be configured for a uniform data sampling rate (e.g., spectra per second) but independent integration times in different active pixel regions to provide appropriate amplitude signals for all desired signals. Portions of each of these signals may be combined to provide a composite spectrum of increased utility and dynamic range for the various independent wavelengths of interest for the process control application. Furthermore, automatic and independent gain control is permitted by the setting of the integration times for each independent active pixel region.

In addition, the design of the disclosed multimode configurable spectrometer emphasizes low light detection. The combination of tall pixels and a long sensor dimension in the wavelength dispersion direction of the current optical sensor permits the use of a wider optical slit with equivalent wavelength resolution. When used in conjunction with a multimode configurable spectrometer of the disclosure, the tall pixels of the optical sensor permits use of a tall slit and hence greater overall light collection. In further combination, the use of shutter function for an active pixel region and active pixel region height allows for very wide dynamic range of light collection. In the case of a multimode configurable spectrometer including a variable width slit, the slit width may be controlled as part of the operating mode of the multimode configurable spectrometer.

When applied to pulsed plasma chambers additional operating modes of the optical sensor and multimode configurable spectrometer of the disclosure are beneficial. These modes include, but are not limited to: a) synchronization of the optical signal collection to a pulsed plasma; b) synchronization using the shutter; and c) time-resolved spectroscopy for pulsed-plasma OES. For synchronized operating modes, it may be convenient to maintain the data interval at some convenient number (e.g., 20 Hz) even though the pulse frequency isn't commensurate with that interval. The pulsed-plasma frequency may be locked to the electronic shutter or other function of an optical sensor or conversion circuitry and not the data interval. There may be no aliasing, and no requirement to predetermine unusual integration times, or use integration times incommensurate with the data interval. This operating mode may be supported, for example, by low latency communication between semiconductor process tool 105 and sensor controller 150 of FIG. 1.

For time-resolved spectroscopy for pulsed-plasma OES, the electronic shutter may be used to keep the exposure time short compared to the pulse period and various portions of the pulse cycle may be sampled using appropriately timed delays between the pulse generator of the plasma and the activation of the electronic shutter. For example, if the exposure time of an active pixel region is $\frac{1}{10}$ the plasma pulse period, 10 relatively temporally displaced reads of optical signals may be used to represent the OES trend during different parts of the period. The optical data may be collected by repeatedly scanning the location of the exposure time within the period in steps of $\frac{1}{10}$ the period.

In IEP processes where very short duration flashlamp pulses of light are used to interrogate the workpiece, spectrometer systems have typically utilized pairs of subtracted measurements to isolate the IEP signal in the presence of OES light. Typically an IEP light pulse may be a few microseconds and typical integration times are minimally multiple milliseconds leading to considerable contamination of the IEP and OES signals. With selective timing and integration per active pixel region, provided by a multimode configurable spectrometer of the disclosure, the electronic shutter function may be synchronized to the IEP light pulse and be of very short duration without impacting overall data intervals. Gating the IEP light pulse can result in very significant reduction of combined IEP and OES signals and remove the need for the paired subtracted measurements. This change subsequently permits 2× greater measurement sample rates.

Independent digitization of the electrical signals from independent active pixel regions of the optical sensor of the multimode configurable spectrometer of the disclosure permits relative adjustment of the wavelength resolution and related improvements in signal-to-noise ratio. For example, a first optical signal from an active pixel region may be configured for reading 1201 wavelength values for spectrum (200-800 nm, 0.5 nm resolution), but a second optical signal from an active pixel region may improve signal-to-noise ratio by binning multiple adjacent pixels (electrical signal summing) prior to digitization and providing a resultant lower resolution spectrum. Furthermore, the independent digitization can be employed to have a first optical signal from an active pixel region with full spectral data but a second optical signal from an active pixel region with only a few values retained and the others removed to avoid handling and storage of excessive unrequired data.

Changes may be made in the optical measurement systems and subsystems described herein without departing from the scope hereof. For example, although certain examples are described in association with semiconductor wafer processing equipment, it may be understood that the optical measurement systems described herein may be adapted to other types of processing equipment such as roll-to-roll thin film processing, solar cell fabrication or any application where high precision optical measurement may be required. Furthermore, although the term "wafer" has been used herein when describing aspects of the current disclosure, it should be understood that other types of workpieces such as quartz plates, phase shift masks, LED substrates and other non-semiconductor processing related substrates and workpieces including solid, gaseous and liquid workpieces may be used.

The embodiments described herein were selected and described in order to best explain the principles of the disclosure and the practical application, and to enable others of ordinary skill in the art to understand the disclosure for various embodiments with various modifications as are suited to the particular use contemplated. The particular embodiments described herein are in no way intended to limit the scope of the present disclosure as it may be practiced in a variety of variations and environments without departing from the scope and intent of the disclosure. Thus, the present disclosure is not intended to be limited to the embodiments shown, but is to be accorded the widest scope consistent with the principles and features described herein.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

As will be appreciated by one of skill in the art, the disclosure or parts thereof may be embodied as a method, system, or computer program product. Accordingly, the features disclosed herein, or at least some of the features, may take the form of an entirely hardware embodiment, an entirely software embodiment (including firmware, resident software, micro-code, etc.) or an embodiment combining software and hardware aspects all generally referred to herein as a "circuit" or "module." Some of the disclosed features may be embodied in or performed by various processors, such as digital data processors or computers, wherein the computers are programmed or store executable programs of sequences of software instructions to perform one or more of the steps of the methods. Thus, features or at least some of the features disclosed herein may take the form of a computer program product on a non-transitory computer-usable storage medium having computer-usable program code embodied in the medium. The software instructions of such programs can represent algorithms and be encoded in machine-executable form on non-transitory digital data storage media.

Thus, portions of disclosed examples may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Those skilled in the art to which this application relates will appreciate that other and further additions, deletions, substitutions and modifications may be made to the described embodiments.

Various aspects of the disclosure can be claimed including the apparatuses, systems and methods as disclosed herein. Aspects disclosed herein include:

A. A multimode configurable spectrometer includes: (1) an optical sensor configured to receive an optical input and convert the optical input to electrical signals, wherein the optical sensor includes multiple active pixel regions for converting the optical input to the electrical signals, and (2) conversion circuitry, having multiple selectable converting circuits, that is configured to receive and convert the electrical signals to a digital output according to a selected one of the selectable converting circuits.

B. A method of operating a multimode configurable spectrometer. In one embodiment, the method includes: (1) converting an optical input to electrical signals employing at least one of multiple active pixel regions of an optical sensor, (2) providing the electrical signals to conversion circuitry having multiple selectable converting circuits, and (3) converting the electrical signals to a digital output via one of the selectable converting circuits.

C. An optical monitoring system includes: (1) an optical interface configured to communicate light observed from a process chamber, (2) a multimode configurable spectrometer configured to receive the light from the optical interface as an optical input. The multimode configurable spectrometer including: (2A) an optical sensor configured to convert the optical input to electrical signals, wherein the optical sensor includes multiple active pixel regions for converting the optical input to the electrical signals, (2B) conversion circuitry, having multiple selectable converting circuits, that is configured to receive and convert the electrical signals to a digital output according to a selected one of the selectable converting circuits; and (2C) a sensor controller configured to, based on the optical input, set an operating mode of the optical sensor and select one of the selectable converting circuits to provide the digital output.

D. A multimode configurable spectrometer that includes: (1) an optical sensor including multiple active pixel regions for converting an optical input to electrical signals and a shift register for each of the multiple active pixel regions, wherein each of the active pixel regions are independently controllable, (2) conversion circuitry, including selectable converting circuits, configured to receive and convert the electrical signals to a digital output according to a selected one of the selectable converting circuits, wherein a unique set of at least four different selectable converting circuits are connected to each of the shift registers, and the at least four different selectable converting circuits include a circuit having a high speed analog-to-digital convertor, a circuit having a low speed analog-to-digital convertor, and a combining circuit, and (3) a sensor controller configured to change, based on a type of the optical input, an operating mode of the optical sensor and a selected one of the selectable converting circuits to provide the digital output.

Each of the aspects A, B, C, and D may have one or more of the following additional elements in combination: Element 1: further comprising a sensor controller configured to direct operation of the optical sensor and to select at least one of the selectable converting circuits to provide the digital output. Element 2: wherein the sensor controller is configured to set an operating mode of the optical sensor to direct operation thereof and is configured to select the at least one of the selectable converting circuits based on the operating mode. Element 3: wherein the sensor controller is configured to dynamically set the operating mode and to dynamically select the at least one of the selectable converting circuits. Element 4: wherein the sensor controller is configured to dynamically set the operating mode and to dynamically select the at least one of the selectable converting circuits based on the optical input received by the optical sensor. Element 5: wherein the sensor controller includes a programmable integrated circuit that is configured to set the operating mode of the optical sensor. Element 6: wherein the sensor controller includes a processor that is configured to process the digital output. Element 7: wherein at least one of the selectable converting circuits is a combining circuit configured to receive and convert signals from at least two of the multiple active pixel regions to the digital output. Element 8: wherein the combining circuit includes a summing circuit, a differencing circuit, a dividing circuit, a multiplying circuit, or an interleaving circuit. Element 9: further comprising a shift register for each of the multiple active pixel regions, wherein each shift register has at least two different ones of the selectable converting circuits coupled thereto. Element 10: wherein the at least two different ones of the selectable converting circuits include a selectable converting circuit having a high speed analog-to-digital convertor and a selectable converting circuit having a low speed analog-to-digital convertor. Element 11: wherein at least one of the multiple active pixel regions has multiple rows that are independently processed to determine the digital output. Element 12: wherein the optical input includes multiple optical signals. Element 13: wherein the multiple optical signals include different types of optical signals. Element 14: wherein the optical signals are a type of optical signal selected from the list consisting of continuous optical signals, pulsed optical signals, optical emission spectroscopy (OES) signals, interferometric endpoint (IEP) signals, combined OES and IEP signals and combined continuous and pulsed optical signals. Element 15: wherein the optical input includes multiple optical signals, and the sensor controller is configured to set the operating mode based on a type of at least one of the multiple optical signals. Element 16: wherein the optical input includes multiple optical signals, and the sensor controller is configured to set the operating mode based on characteristics of at least one of the multiple optical signals. Element 17: wherein the characteristics include a signal level, a signal-to-noise ratio, a sampling rate, a pulse rate, or a wavelength region. Element 18: wherein the optical input includes multiple optical signals, and the sensor controller is configured to set the operating mode based upon a type of one of the multiple optical signals being OES. Element 19: wherein the optical input includes multiple optical signals, and the sensor controller is configured to set the operating mode based upon a type of one of the multiple optical signals being IEP. Element 20: wherein the optical input includes multiple optical signals, and the sensor controller is configured to set the operating mode based upon a type of one of the multiple optical signals being a combination of OES and IEP. Element 21: wherein the optical sensor further includes multiple outputs for each of the multiple active pixel regions. Element 22: wherein the digital output includes multiple digital signals. Element 23: wherein the sensor controller is configured to direct operation of the optical sensor by employing an electronic shutter for at least a portion of one of the active pixel regions. Element 24: further comprising receiving the optical input from a monitored semiconductor process and receiving a selection for an operating mode from an external system associated with the monitored semiconductor process. Element 25: wherein receiving the selection for the operating mode occurs before the monitored semiconductor process begins. Element 26: further comprising selecting an operating mode for the optical sensor and selecting the one of the selectable converting circuits. Element 27: wherein at least one of the selecting the mode and the selecting the one is performed dynamically. Element 28: wherein a basis for selecting the mode and for selecting the one is selected from the list consisting of: type of optical input, characteristics of the optical input, signal-to-noise ratio values of digital output, and data rate. Element 29: wherein types of the optical input include continuous optical signals, pulsed optical signals, optical emission spectroscopy (OES) signals, interferometric endpoint (IEP) signals, combined OES and IEP signals and combined continuous and pulsed optical signals. Element 30: wherein the selecting the one of the selectable converting circuits includes selecting a circuit from the list consisting of: a circuit having a high speed analog-to-digital convertor, a circuit having a low speed analog-to-digital convertor, and a combining circuit. Element 31: wherein the sensor controller is configured to receive a selection of the operating mode and a selection of the one of the selectable converting circuits from an external system associated with the process chamber. Element 32: wherein the sensor controller selects the operating mode and the selectable converting circuit according toا a semiconductor process in the process chamber that generates the light. Element 33: wherein the sensor controller dynamically selects different operating modes and different ones of the selectable converting circuits during the semiconductor process. Element 34: wherein the operating mode and the selectable converting circuits are selected according to a type of the light observed in the process chamber. Element 35: wherein the type of the light is selected from the list consisting of: continuous optical signals, pulsed optical signals, optical emission spectroscopy (OES) signals, interferometric endpoint (IEP) signals, combined OES and IEP signals and combined continuous and pulsed optical signals. Element 36: wherein the multimode configurable spectrometer further comprises a shift register for each of the multiple active pixel regions, wherein each of the shift registers has at least two different ones of the selectable converting circuits coupled thereto. Element 37: wherein the at least two different ones of the selectable converting circuits include a selectable converting circuit having a high speed analog-to-digital convertor and a selectable converting circuit having a low speed analog-to-digital convertor. Element 38: wherein the selectable converting circuits further include a combining circuit coupled to at least two of the shift registers.

What is claimed is:

1. A multimode configurable spectrometer, comprising:
an optical sensor configured to receive an optical input and convert the optical input to electrical signals, wherein the optical sensor includes multiple active pixel regions for converting the optical input to the electrical signals;
a separate and independent shift register for each of the multiple active pixel regions, wherein at least one of the multiple active pixel regions includes a row of pixels; and
conversion circuitry, having multiple selectable converting circuits, that is configured to receive and convert the electrical signals to a digital output according to a selected one of the selectable converting circuits, wherein the selected one is selected from the selectable converting circuits based on phasing of a clocking signal of the optical sensor, each of the separate and independent shift registers has at least two different ones of the selectable converting circuits coupled thereto, and at least one of the separate and independent shift registers has one of the at least two different ones of the selectable converting circuits coupled to opposing ends thereof.

2. The multimode configurable spectrometer as recited in claim 1 further comprising a sensor controller configured to provide the clocking signal to the optical sensor.

3. The multimode configurable spectrometer as recited in claim 2 wherein the sensor controller is configured to set an operating mode of the optical sensor, wherein the clocking signal is based on the operating mode.

4. The multimode configurable spectrometer as recited in claim 3 wherein the sensor controller is configured to dynamically set the operating mode and to dynamically select the at least one of the selectable converting circuits based on the clocking signal.

5. The multimode configurable spectrometer as recited in claim 4 wherein the sensor controller is configured to dynamically set the operating mode and to dynamically select the selected one of the selectable converting circuits based on the optical input received by the optical sensor.

6. The multimode configurable spectrometer as recited in claim 3 wherein the sensor controller includes a programmable integrated circuit that is configured to set the operating mode of the optical sensor.

7. The multimode configurable spectrometer as recited in claim 3 wherein the optical input includes multiple optical signals, and the sensor controller is configured to set the operating mode based on a type of at least one of the multiple optical signals.

8. The multimode configurable spectrometer as recited in claim 3 wherein the optical input includes multiple optical signals, and the sensor controller is configured to set the operating mode based on characteristics of at least one of the multiple optical signals.

9. The multimode configurable spectrometer as recited in claim 8 wherein the characteristics include a signal level, a signal-to-noise ratio, a sampling rate, a pulse rate, or a wavelength region.

10. The multimode configurable spectrometer as recited in claim 3 wherein the optical input includes multiple optical signals, and the sensor controller is configured to set the operating mode based upon a type of one of the multiple optical signals being OES.

11. The multimode configurable spectrometer as recited in claim 3 wherein the optical input includes multiple optical signals, and the sensor controller is configured to set the operating mode based upon a type of one of the multiple optical signals being IEP.

12. The multimode configurable spectrometer as recited in claim 3 wherein the optical input includes multiple optical signals, and the sensor controller is configured to set the operating mode based upon a type of one of the multiple optical signals being a combination of OES and IEP.

13. The multimode configurable spectrometer as recited in claim 2 wherein the sensor controller is configured to direct operation of the optical sensor by employing an electronic shutter for at least a portion of one of the active pixel regions.

14. The multimode configurable spectrometer as recited in claim 1 wherein the phasing of the clocking signal controls a shifting direction of the electrical signals along the separate and independent shift registers.

15. The multimode configurable spectrometer as recited in claim 1 wherein at least one of the selectable converting circuits is a combining circuit coupled to each of the separate and independent shift registers and configured to receive and convert signals from at least two of the multiple active pixel regions to the digital output.

16. The multimode configurable spectrometer as recited in claim 15 wherein the combining circuit includes a summing circuit, a differencing circuit, a dividing circuit, a multiplying circuit, or an interleaving circuit.

17. The multimode configurable spectrometer as recited in claim 1, wherein each of the separate and independent shift registers has a first output that is coupled to a first one of the at least two different ones of the selectable converting circuits and a second output that is coupled to a second one of the at least two different one of the selectable converting circuit.

18. The multimode configurable spectrometer as recited in claim 17 wherein the first one of the at least two different ones of the selectable converting circuits include a selectable converting circuit having a high speed analog-to-digital convertor and the second one of the at least two different ones of the selectable converting circuits includes a selectable converting circuit having a low speed analog-to-digital convertor.

19. The multimode configurable spectrometer as recited in claim 1 wherein at least one of the multiple active pixel regions has multiple rows that are independently processed to determine the digital output.

20. The multimode configurable spectrometer as recited in claim 1 wherein the optical input includes multiple optical signals.

21. The multimode configurable spectrometer as recited in claim 20 wherein the multiple optical signals include different types of optical signals.

22. The multimode configurable spectrometer as recited in claim 21 wherein the optical signals are a type of optical signal selected from the list consisting of:
continuous optical signals, pulsed optical signals, optical emission spectroscopy (OES) signals, interferometric endpoint (IEP) signals, combined OES and IEP signals and combined continuous and pulsed optical signals.

23. The multimode configurable spectrometer as recited in claim 1 wherein the optical sensor further includes multiple outputs for each of the multiple active pixel regions.

24. The multimode configurable spectrometer as recited in claim 1 wherein the digital output includes multiple digital signals.

25. A method of operating a multimode configurable spectrometer, comprising:
converting an optical input to electrical signals employing at least one of multiple active pixel regions of an optical sensor, wherein each of the multiple active pixel regions has a separate and independent shift register, and at least one of the multiple active pixel regions includes a row of pixels;
providing the electrical signals to conversion circuitry via one of the separate and independent shift registers, wherein the conversion circuitry has multiple selectable converting circuits, each of the separate and independent shift registers has at least two different ones of the selectable converting circuits coupled thereto, and at least one of the separate and independent shift registers has one of the at least two different ones of the selectable converting circuits coupled to opposing ends thereof;
selecting a selected converting circuit from the selectable converting circuits based on phasing of a clocking signal of the optical sensor; and
converting the electrical signals to a digital output via the selected one of the selectable converting circuits.

26. The method as recited in claim 25 further comprising receiving the optical input from a monitored semiconductor process and receiving a selection for an operating mode from an external system associated with the monitored semiconductor process.

27. The method as recited in claim 26 wherein receiving the selection for the operating mode occurs before the monitored semiconductor process begins.

28. The method as recited in claim 25 further comprising selecting an operating mode for the optical sensor, wherein the clocking signal is based on the operating mode.

29. The method as recited in claim 28 wherein at least one of the selecting the mode and the selecting the one is performed dynamically.

30. The method as recited in claim 28 wherein a basis for selecting the mode is selected from the list consisting of:
type of optical input,
characteristics of the optical input,
signal-to-noise ratio values of digital output, and
data rate.

31. The method as recited in claim 30 wherein types of the optical input include continuous optical signals, pulsed optical signals, optical emission spectroscopy (OES) signals, interferometric endpoint (IEP) signals, combined OES and IEP signals and combined continuous and pulsed optical signals.

32. The method as recited in claim 25 wherein the selecting the selected converting circuit includes selecting a circuit from the list consisting of:
a circuit having a high speed analog-to-digital convertor,
a circuit having a low speed analog-to-digital convertor, and
a combining circuit.

33. An optical monitoring system, comprising:
an optical interface configured to communicate light observed from a process chamber;
a multimode configurable spectrometer configured to receive the light from the optical interface as an optical input, the multimode configurable spectrometer including:
an optical sensor configured to convert the optical input to electrical signals, wherein the optical sensor includes multiple active pixel regions for converting the optical input to the electrical signals, wherein at least one of the multiple active pixel regions includes a row of pixels;
a separate and independent shift register for each of the multiple active pixel regions;
conversion circuitry, having multiple selectable converting circuits, that is configured to receive and convert the electrical signals to a digital output according to a selected one of the selectable converting circuits, wherein each of the separate and independent shift registers has at least two different ones of the selectable converting circuits coupled thereto and at least one of the separate and independent shift registers has one of the at least two different ones of the selectable converting circuits coupled to opposing ends thereof; and
a sensor controller configured to, based on the optical input, set an operating mode of the optical sensor and select from the selectable converting circuits a selected one of the selectable converting circuits to provide the digital output, wherein the sensor controller uses phasing of a clocking signal of the optical sensor to select the selected one of the selectable converting circuits.

34. The optical monitoring system as recited in claim 33 wherein the sensor controller is configured to receive a selection of the operating mode and a selection of the one of the selectable converting circuits from an external system associated with the process chamber.

35. The optical monitoring system as recited in claim 34 wherein the sensor controller selects the operating mode and the selectable converting circuit according to a semiconductor process in the process chamber that generates the light.

36. The optical monitoring system as recited in claim 35 wherein the sensor controller dynamically selects different operating modes and different ones of the selectable converting circuits during the semiconductor process, wherein the sensor controller selects the different ones of the selectable converting circuits by changing the phasing of the clocking signal.

37. The optical monitoring system as recited in claim 34 wherein the operating mode and the selectable converting circuits are selected according to a type of the light observed in the process chamber.

38. The optical monitoring system as recited in claim 37 wherein the type of the light is selected from the list consisting of:

continuous optical signals, pulsed optical signals, optical emission spectroscopy (OES) signals, interferometric endpoint (IEP) signals, combined OES and IEP signals and combined continuous and pulsed optical signals.

39. The optical monitoring system as recited in claim 33 wherein each of the separate and independent shift registers has a first output that is coupled to a first one of the at least two different ones of the selectable converting circuits and a second output that is coupled to a second one of the at least two different one of the selectable converting circuit.

40. The optical monitoring system as recited in claim 39 wherein the first one of the at least two different ones of the selectable converting circuits includes a selectable converting circuit having a high speed analog-to-digital convertor and the second one of the at least two different ones of the selectable converting circuits includes a selectable converting circuit having a low speed analog-to-digital convertor.

41. The optical monitoring system as recited in claim 40 wherein the selectable converting circuits further include a combining circuit coupled to at least two of the separate and independent shift registers.

42. A multimode configurable spectrometer, comprising:

an optical sensor including multiple active pixel regions for converting an optical input to electrical signals and a separate and independent shift register for each of the multiple active pixel regions, wherein each of the active pixel regions are independently controllable and at least one of the multiple active pixel regions includes a row of pixels;

conversion circuitry, including selectable converting circuits, configured to receive and convert the electrical signals to a digital output according to a first selected converting circuit selected from the selectable converting circuits, wherein a unique set of at least three different selectable converting circuits are connected to each of the shift registers, the at least three different selectable converting circuits include a circuit having a high speed analog-to-digital convertor and a circuit having a low speed analog-to-digital convertor, and the at least three different selectable converting circuits are coupled to opposing ends of at least one of the shift registers; and a sensor controller configured to change, based on a type of the optical input, an operating mode of the optical sensor and from the first selected converting circuit to a second selected converting circuit selected from the selectable converting circuits to provide the digital output, wherein the sensor controller is configured to change from the first selected converting circuit to the second selected converting circuit by changing phasing of a clocking signal of the optical sensor.

* * * * *